(12) United States Patent
Zheng

(10) Patent No.: US 9,385,310 B2
(45) Date of Patent: Jul. 5, 2016

(54) PHASE CHANGE MEMORY STRUCTURE COMPRISING PHASE CHANGE ALLOY CENTER-FILLED WITH DIELECTRIC MATERIAL

(71) Applicant: Entegris, Inc., Billerica, MA (US)

(72) Inventor: Jun-Fei Zheng, Westport, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 13/872,087

(22) Filed: Apr. 27, 2013

(65) Prior Publication Data

US 2013/0284999 A1 Oct. 31, 2013

Related U.S. Application Data

(60) Provisional application No. 61/640,043, filed on Apr. 30, 2012, provisional application No. 61/651,106, filed on May 24, 2012, provisional application No. 61/720,128, filed on Oct. 30, 2012.

(51) Int. Cl.
*H01L 45/00* (2006.01)

(52) U.S. Cl.
CPC .............. *H01L 45/06* (2013.01); *H01L 45/124* (2013.01); *H01L 45/144* (2013.01); *H01L 45/16* (2013.01); *H01L 45/1616* (2013.01); *H01L 45/1691* (2013.01)

(58) Field of Classification Search
CPC ... H01L 45/06; H01L 45/144; H01L 45/1233; H01L 45/1675; G11C 13/0004
USPC ........... 257/2, E45.001, E21.068, 4, 211, 616
See application file for complete search history.

(56) References Cited

U.S. PATENT DOCUMENTS 5,596,522 A 1/1997 Ovshinsky et al.
6,281,022 B1 8/2001 Li et al.
(Continued)

FOREIGN PATENT DOCUMENTS

JP 2001-67720 A 3/2001
JP 2002-211924 A 7/2002
(Continued)

OTHER PUBLICATIONS

Karsch, H., et al., "Bis(amidinate) Complexes of Silicon and Germanium", "Eur. J. Inorg. Chemistry", Apr. 1998, pp. 433-436, vol. 4.
(Continued)

*Primary Examiner* — Chuong A Luu
*Assistant Examiner* — Rodolfo Fortich
(74) *Attorney, Agent, or Firm* — Hultquist, PLLC; Steven J. Hultquist; Maggie Chappins

(57) ABSTRACT

A phase change memory structure, including a substrate having a cavity extending from a surface of the substrate into an interior region thereof, wherein the cavity is bounded by side wall surface, wherein the cavity is coated on the side wall surface with a film of phase change memory material defining a core that is at least partially filled with dielectric material such as alumina. Such phase change memory structure can be fabricated in a substrate containing a cavity closed at one end thereof with a bottom electrode, by a method including: conformally coating sidewall surface of the cavity and surface of the bottom electrode closing the cavity, with a phase change memory material film, to form an open core volume bounded by the phase change memory material film; at least partially filling the open core volume with alumina or other dielectric material; and forming a top electrode at an upper portion of the cavity.

20 Claims, 9 Drawing Sheets

(56) References Cited

U.S. PATENT DOCUMENTS

| | | |
|---|---|---|
| 6,908,812 B2 | 6/2005 | Lowrey |
| 7,115,927 B2 | 10/2006 | Hideki et al. |
| 7,371,429 B2 | 5/2008 | Lee et al. |
| 7,397,060 B2 | 7/2008 | Lung |
| 7,402,851 B2 | 7/2008 | Hideki et al. |
| 7,425,735 B2 | 9/2008 | Park et al. |
| 7,462,900 B2 | 12/2008 | Hideki et al. |
| 7,476,917 B2 | 1/2009 | Hideki et al. |
| 7,488,967 B2 | 2/2009 | Burr et al. |
| 7,615,401 B2 | 11/2009 | Park et al. |
| 7,704,787 B2 | 4/2010 | Hideki et al. |
| 7,728,172 B2 | 6/2010 | Lee et al. |
| 7,943,923 B2 | 5/2011 | Gidon |
| 2003/0073295 A1 | 4/2003 | Xu |
| 2005/0029502 A1 | 2/2005 | Hudgens |
| 2006/0049447 A1 | 3/2006 | Lee et al. |
| 2006/0138393 A1 | 6/2006 | Seo et al. |
| 2006/0141710 A1 | 6/2006 | Yoon et al. |
| 2007/0090336 A1 | 4/2007 | Asano et al. |
| 2007/0121363 A1 | 5/2007 | Lung |
| 2007/0160760 A1 | 7/2007 | Shin et al. |
| 2007/0246748 A1 | 10/2007 | Breitwisch et al. |
| 2007/0272950 A1 | 11/2007 | Kim et al. |
| 2008/0118636 A1 | 5/2008 | Shin et al. |
| 2008/0258127 A1 | 10/2008 | Lee et al. |
| 2009/0020738 A1 | 1/2009 | Happ et al. |
| 2009/0057643 A1 | 3/2009 | Chen |
| 2009/0101883 A1 | 4/2009 | Lai et al. |
| 2009/0184309 A1 | 7/2009 | Mathew et al. |
| 2009/0298223 A1 | 12/2009 | Cheek et al. |
| 2010/0012917 A1 | 1/2010 | Takaura et al. |
| 2010/0054029 A1 | 3/2010 | Happ et al. |
| 2010/0270527 A1 | 10/2010 | Sawamura |
| 2010/0270529 A1* | 10/2010 | Lung ............................. 257/4 |
| 2011/0001107 A1* | 1/2011 | Zheng ........................... 257/2 |
| 2011/0065252 A1 | 3/2011 | Nakamura |
| 2011/0155989 A1 | 6/2011 | Park et al. |
| 2011/0227021 A1 | 9/2011 | Schrott et al. |
| 2011/0260132 A1 | 10/2011 | Zheng et al. |

FOREIGN PATENT DOCUMENTS

| | | |
|---|---|---|
| JP | 2006-511716 A | 4/2006 |
| JP | 2006-124262 A | 5/2006 |
| JP | 2006-182781 A | 7/2006 |
| JP | 2008-252088 A | 10/2008 |
| JP | 2011-66135 A | 3/2011 |
| KR | 10-2004-0076225 A | 8/2004 |
| KR | 10-2006-0091160 A | 8/2006 |
| KR | 10-0695168 B1 | 3/2007 |
| KR | 10-2007-0105752 A | 10/2007 |
| KR | 10-2008-0080273 A | 9/2008 |
| KR | 10-2011-0076394 A | 7/2011 |
| KR | 10-1067969 B1 | 9/2011 |
| WO | 2004046417 A2 | 6/2004 |
| WO | 2005084231 A2 | 9/2005 |
| WO | 2006012052 A2 | 2/2006 |
| WO | 2007070218 A2 | 6/2007 |
| WO | 2007126690 A2 | 11/2007 |
| WO | 2008057616 A2 | 5/2008 |

OTHER PUBLICATIONS

Lee, J., et al., "GeSbTe deposition for the PRAM application", "Applied Surface Science", Feb. 2007, pp. 3969-3976, vol. 253, No. 8.

Raoux, S., et al., "Influence of Dopants on the Crystallization Temperature, Crystal Structure, Resistance, and Threshold Field for Ge2Sb2Te5 and GeTe Phase Change Materials", "European/Phase Change and Ovonics Symposium", Sep. 4-6, 2011, pp. 18, Published in: Zuerich, Switzerland.

Raoux, S., et al., "Materials Engineering for Phase Change Random Access Memory", "11th Annual Non-Volatile Memory Technology Symposium (NVMTS)", Nov. 7-9, 2011, pp. 1-5.

Stauf, G., et al., "Low Temperature ALD of Germanium for Phase Change Memory Thin Films", "AVS 7th International Conference on Atomic Layer Deposition—ALD 2007", Jun. 24, 2007, pp. 1-8.

Horii, H., et al., "A Novel Cell Technology Using N-Doped Gesbte Films for Phase Change RAM", "Symposium on VLSI Technology Digest of Technology Digest of Technical Papers", Jun. 10-12, 2003, pp. 177-178.

Kim, R., et al., "Structural Properties of Ge2Sb2Te5 thin films by metal organic chemical vapor deposition for phase change memory applications", "Applied Physics Letters", Sep. 6, 2006, pp. 1021071-1021073, vol. 89.

Note: For the non-patent literature citations that no month of publication is indicated, the year of publication is more than 1 year prior to the effective filing date of the present application.

* cited by examiner

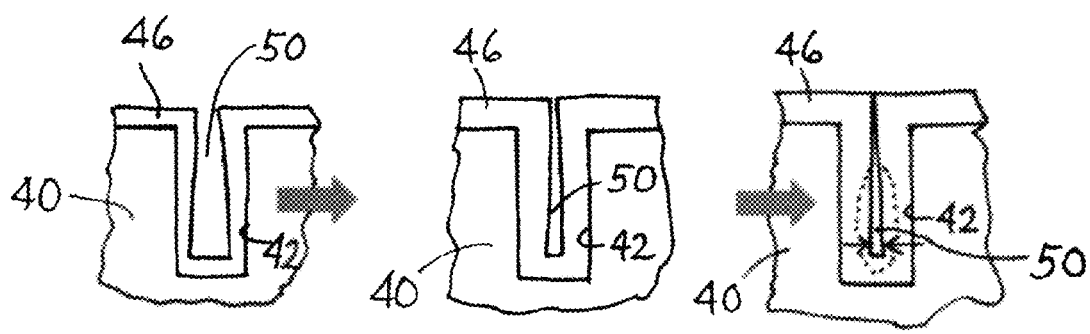
FIG. 7    FIG. 8    FIG. 9
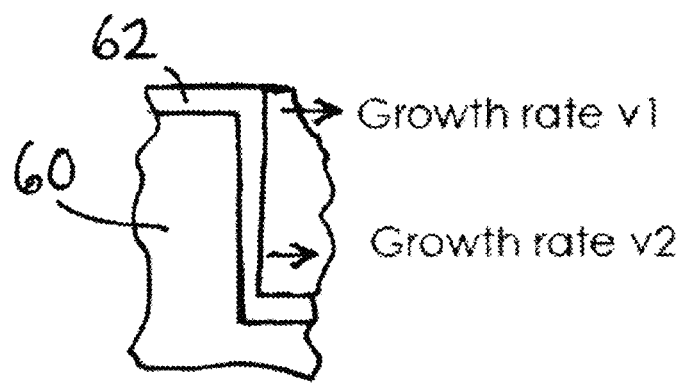
FIG. 10

FIG. 12  FIG. 13  FIG. 14  FIG. 15
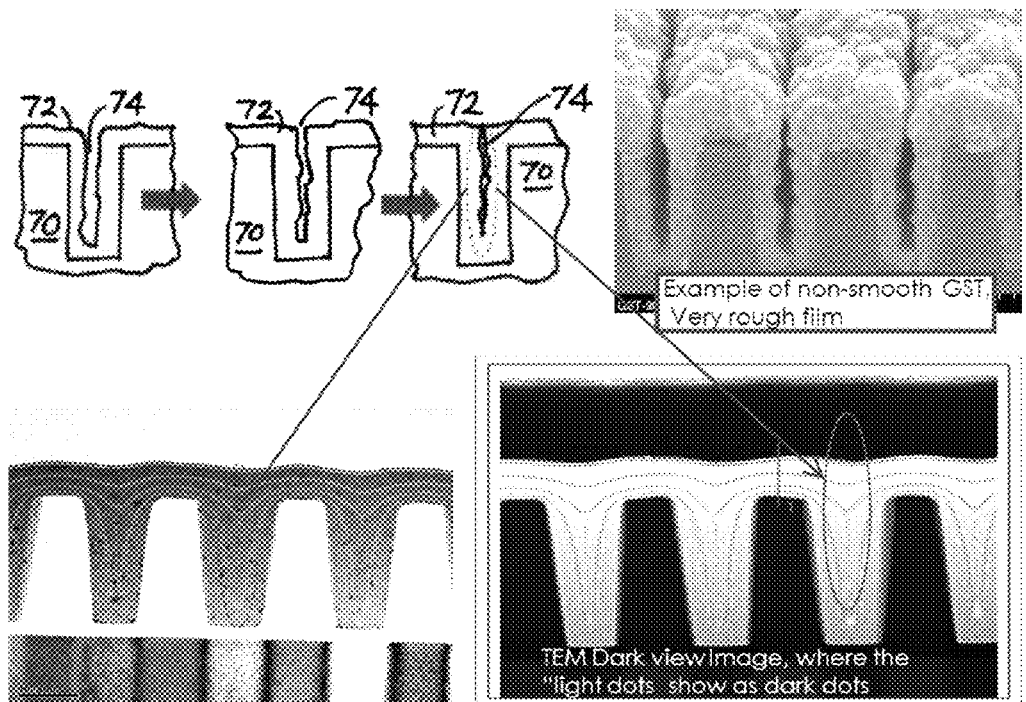
FIG. 16  FIG. 17
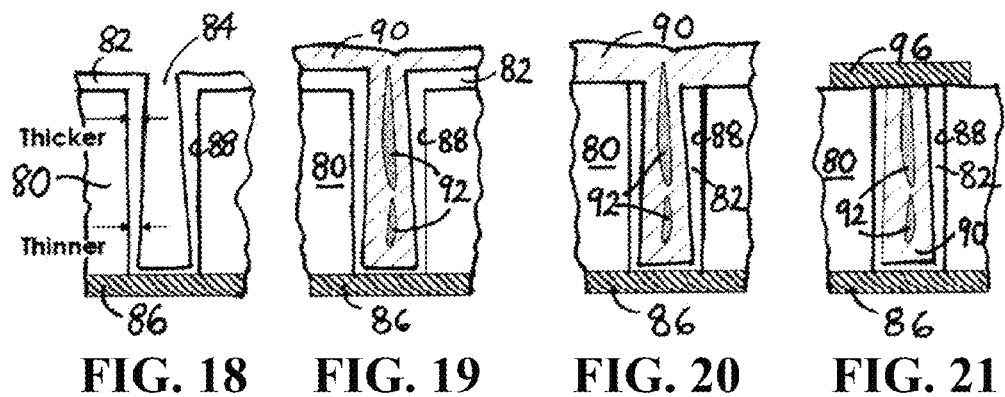
FIG. 18  FIG. 19  FIG. 20  FIG. 21

PHASE CHANGE MEMORY STRUCTURE COMPRISING PHASE CHANGE ALLOY CENTER-FILLED WITH DIELECTRIC MATERIAL

CROSS-REFERENCE TO RELATED APPLICATIONS

This application claims the benefit under 35 U.S.C. §119 of U.S. Provisional Patent Application No. 61/640,043 filed on Apr. 30, 2012, U.S. Provisional Patent Application No. 61/651,106 filed on May 24, 2012, and U.S. Provisional Patent Application No. 61/720,128 filed on Oct. 30, 2012. The disclosures of all of the foregoing applications are hereby incorporated herein by reference in their respective entireties, for all purposes.

FIELD

The present disclosure relates to phase change memory devices and device structures, and to methods of making same.

DESCRIPTION OF THE RELATED ART

Phase change memory (PCM) is a type of non-volatile computer memory that utilizes differences in the electrical resistivity of the crystalline and amorphous phase states of memory materials. Devices that incorporate PCM typically comprise substrates on which a particular memory material (e.g., a chalcogenide) is deposited. The memory material is typically deposited within structures (such as holes, trenches, or the like) in or on the surfaces of the substrate. Patterned electrodes are also deposited on the substrate to allow for the conduction of current. The conduction of current is effected through the deposited memory material, with the level of current being dependent on the resistivity and heating efficiency of such memory material and its alloy properties on phase change.

Memory materials used in the manufacture of PCM devices include germanium antimony telluride (GST) and germanium-telluride (GeTe). The GST materials can function in principle very effectively as phase change material for a volume, v, having characteristic dimensions as small as 5 nm. The trend is to make PCM devices based on GST with characteristic dimensions in the regime of 30 to 10 nm or less in future generations of devices. Also, to confine the heat for phase change, a hole structure with dielectric surrounding the hole is highly preferred, with the aspect ratio of the hole being greater than 1, typically greater than 3:1 to improve heating efficiency. The deposition of germanium antimony telluride by vapor deposition processes, e.g., chemical vapor deposition (CVD) or atomic layer deposition (ALD), can be carried out to produce a film of amorphous phase or limited crystallinity. The deposition of germanium antimony telluride is difficult to achieve because non-perfect conformality (<100%) or smooth surfaces will leave voids deep inside the hole. This is because GST is deposited faster on the upper portions of the wall of the hole. The hole as a result may be filled at the upper part of the hole and occluded from deposition on the lower surfaces in the hole. Even if the deposition is 100% conformal, any non-smooth surface due to the protrusion of GST as the result of locally enhanced growth, especially local crystalline growth that is typically faster than the amorphous growth that provides the best conformality, will also lead to void formation in the center of the hole structure where the growth of materials from the respective sidewalls merge with one another at non-perfect ending surfaces. A "seam" or lower density or different composition materials in the GST filled structure can also form as the films on the side walls of the hole or trench meet. One mechanism of seam formation reduced materials transport into the interior of the hole or trench as the hole or trench is progressively filled. This protrusion-like growth is readily formed for GST materials with high levels of crystallization or at low crystallization temperature, which provides a faster phase change alloy for PCM. Furthermore, as desired device performance in terms of smaller reset current and higher speed is realized, the cross section of the hole becomes smaller and the height becomes larger (illustrative hole geometries involving, for example, holes less than 20 nm in diameter or equivalent diameter but with depths of greater than 30 nm). The manufacturing of these hole structures (less than 20 nm) is costly and technologically challenging because it is difficult to fabricate small holes with precision control, and high aspect ratio small holes are difficult to attain for ion etch processes, as ions become difficult to transport into the small and deep holes during the etching process.

For smaller structures of 10 nm diameter, in order to keep the cross-sectional area of the hole variation to about 10%, a 10 nm feature has an approximately 5% diameter variation, which is 0.5 nm and is close to the molecular size of lithography resist. In comparison, maintaining a 30 nm diameter with 10% variation of cross-sectional area requires about 1.5 nm diameter control, which is more readily achieved. The coated GST film thickness on the wall of the hole is controlled by conformal deposition of GST, independent of the lithographic process, and is typically about 1% of the deposition thickness regardless of the absolute thickness of the film, which is very easy to control. Moreover, sufficiently filling smaller holes (whether from starting as a small hole about 5 nm or 10 nm in diameter with dielectric surrounding it, or during the latter stage of GST deposition in filling a hole of 30 to 100 nm, the small holes in these two cases having large aspect ratios) has always been challenging due to problems associated with molecular transport into small and deep holes. The hole depth of the PCM device is continually increasing in further device development, adding additional difficulty.

SUMMARY

The present disclosure relates to phase change memory devices and device structures, and to methods of making same, e.g., with phase change alloy compositions such as germanium-antimony-telluride (GST) or germanium-telluride (GeTe).

In one aspect, the disclosure relates to a phase change memory structure, comprising a substrate having a cavity extending from a surface of the substrate into an interior region thereof, wherein said cavity is bounded by side wall surface, wherein the cavity is coated on said side wall surface with a film of phase change memory material defining a core that is at least partially filled with alumina.

In another aspect, the disclosure relates to a method of fabricating a phase change memory structure in a substrate containing a cavity closed at one end thereof with a bottom electrode, the method comprising:
conformally coating sidewall surface of the cavity and surface of the bottom electrode closing the cavity, with a phase change memory material film, to form an open core volume bounded by the phase change memory material film;
at least partially filling the open core volume with alumina; and forming a top electrode at an upper portion of the cavity.

A further aspect of the disclosure relates to a phase change memory device comprising at least one phase change memory structure of the present disclosure.

In another aspect, the disclosure relates to a method of forming a phase change memory structure comprising a phase change memory material in a substrate, comprising filling seam(s) or void(s) in the phase change memory material with alumina deposited by atomic layer deposition.

A further aspect of the disclosure relates to a phase change memory structure comprising multiple layers of phase change memory material wherein each layer of phase change memory material is separated from a next successive layer of phase change material in the structure by a monolayer or near-monolayer film of alumina.

Yet another aspect of the disclosure relates to a method of making a phase change memory structure, comprising depositing a phase change memory material alternatingly with depositing a monolayer or near-monolayer film of alumina, to form a phase change memory structure comprising multiple layers of the phase change memory material wherein each layer of the phase change memory material is separated from a next successive layer of the phase change material in the structure by a monolayer or near-monolayer film of alumina.

The disclosure in a further aspect relates to a phase change memory structure, comprising a substrate having a cavity extending from a surface of the substrate into an interior region thereof, wherein said cavity is bounded by side wall surface, wherein the cavity is coated on said side wall surface with a film of phase change memory material forming a core, and the core is filled with dielectric material containing void volume that is fully encapsulated in the dielectric material to isolate it from the phase change material.

Another aspect of the disclosure relates to a method of making a phase change memory structure in a substrate having a cavity extending from a surface of the substrate into an interior region thereof, wherein said cavity is bounded by side wall surface, said method comprising coating said side wall surface with a film of phase change memory material to form an open volume core, and depositing dielectric material in said core so as to fully encapsulate void volume in the dielectric material so that the void volume is isolated from the phase change material.

Other aspects, features and embodiments of the invention will be more fully apparent from the ensuing disclosure and appended claims.

BRIEF DESCRIPTION OF THE DRAWINGS

FIGS. 7-9 depict a schematic rendering of process flow for fill of a trench cavity with GST material, showing formation of a "keyhole" void in FIG. 9.

FIG. 10 is a schematic elevation view of a portion of a trench cavity, showing the profile of the phase change memory material deposited in the cavity, under differential growth rate conditions, resulting in thicker sidewall deposits at the upper portion of the cavity, in relation to the lower portion of the cavity.

FIGS. 12-14 depict process flow in which deposition of phase change alloy material results in void seam formation.

FIG. 15 depicts a non-smooth GST deposit in trench structures, consistent with the schematic view of FIG. 14.

FIG. 16 is a tunneling electron microscope (TEM) Z contrast image, wherein the "dot" line in the middle of the GST-filled trench is a void.

FIG. 17 is a TEM dark view image in which the light dots of FIG. 16 are shown as dark dots.

FIGS. 18-21 schematically depict a process flow in which a phase change memory alloy is deposited, followed by deposition of alumina in the central void circumscribed by the phase change memory material, wherein the voids are isolated from the phase change memory material in the final PCM cell structure schematically shown in FIG. 21.

DETAILED DESCRIPTION

Figure 1:
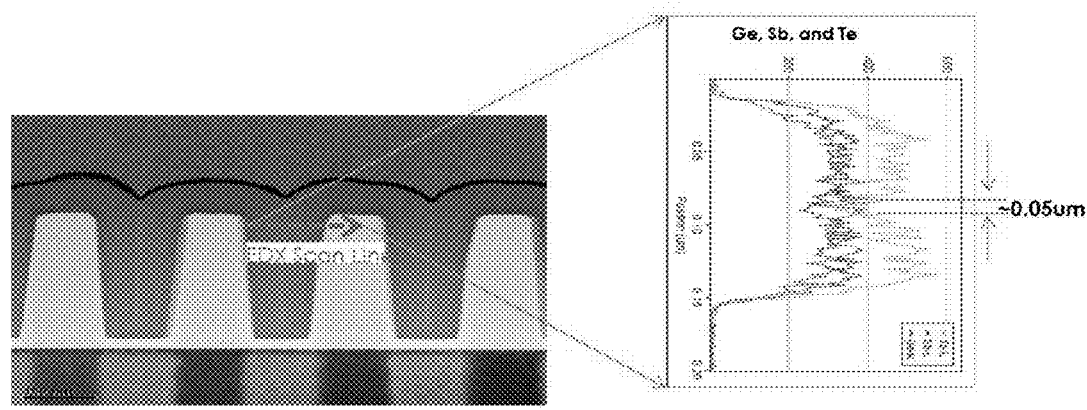
FIG. 1 is a cross-sectional tunneling electron microscope (TEM) image of a GST-filled trench ($SiO_2$-based) (left-hand portion of drawing) and an energy dispersive x-ray analysis plot for each of the germanium, antimony and tellurium components of the GST fill material (right-hand portion of drawing).

The present disclosure relates to phase change memory devices and device structures, and to methods of making such phase change memory devices and device structures, e.g., with phase change alloy compositions such as germanium-antimony-telluride (GST) or germanium-telluride (GT), or with other chalcogenide materials.

All percentages expressed herein are atomic percentages.

Unless otherwise specified, all film compositions herein are specified in terms of atomic percentages of the film components, wherein the sum of all atomic percentages of all components in the film totals to 100 atomic %.

As used herein, the term CVD is defined as the deposition of a solid on a surface from a chemical precursor, and includes but is not limited to the following: Atmospheric pressure CVD (APCVD), Low pressure CVD (LPCVD), Ultrahigh vacuum CVD (UHVCVD), Aerosol-assisted CVD (AACVD), Digital CVD (DCVD), Direct liquid injection CVD (DLICVD), Microwave plasma-assisted CVD (MPCVD), Plasma-enhanced CVD (PECVD), Remote plasma-enhanced CVD (RPECVD), Atomic layer CVD (ALCVD), Hot wire CVD (HWCVD), Metalorganic chemical vapor deposition (MOCVD), Hybrid physical-chemical vapor deposition (HPCVD), Rapid thermal CVD (RTCVD), and Vapor phase epitaxy (VPE).

In one aspect, the disclosure relates to a phase change memory structure, comprising a substrate having a cavity extending from a surface of the substrate into an interior region thereof, wherein said cavity is bounded by side wall surface, wherein the cavity is coated on said side wall surface with a film of phase change memory material defining a core that is at least partially filled with a suitable dielectric material, e.g., alumina, or germanium oxide.

The cavity in such phase change memory structure may be of any suitable type, and may for example comprise a hole or a trench.

The phase change memory material used in the phase change memory structure the present disclosure may be of any suitable type, and can for example comprise a chalcogenide alloy composition, e.g., a germanium-antimony-tellurium (GST) alloy or a germanium-telluride (GT) alloy.

The phase change alloy can for example comprise an alloy composition such as: 325 GST; 225 GST; 415 GST; 073 GST; 147 GST; GeTe; or $Ge_xTe_y$ with reduced Te. Additional specific GST and GT alloy compositions include, without limitation:
(i) material of the formula $Ge_xSb_yTe_zC_mN_nO_i$.
wherein:
x is about 0.1-0.6, y is about 0-0.7, z is about 0.2-0.9, m is about 0.02-0.20, n is about 0.02-0.20, and i is about 0-0.1;
(ii) material of the formula $Ge_xSb_yTe_zA_m$, wherein A is a dopant element selected from the group of N, C, In, Sn, and Se, and wherein x is from 0.1 to 0.6, y is from 0 to 0.7, z is from 0.2 to 0.9, and m is from 0 to 0.15;
(iii) material containing 27.5 to 33% germanium, with tellurium up to 55%, and the remainder being antimony;
(iv) 225 GeSbTe doped with germanium to yield germanium-rich GeSbTe material;
(v) germanium-enriched GeSbTe having a ratio of GeTe:$Sb_2Te_3$ that is in a range of from 3:1 to 10:1;
(vi) GeSbTe material containing 25 to 60% germanium, 8 to 25% antimony, and 40 to 55% tellurium;
(vii) $Ge_xTe_y$ materials, where x is from 0.5 to 0.7 and y is from 0.3 to 0.6, and
(viii) material selected from the group consisting of materials (ii)-(vi), as doped with at least one of carbon and nitrogen, wherein the amount of each is in a range of from 2 to 20%.

The phase change memory material in specific embodiments may comprise a GST material with an atomic weight ratio of about 2:2:5, or a GST material with an atomic weight ratio of about 3:2:5.

The substrate on which the phase change memory structure is fabricated may be of any suitable type, and may for example comprise $SiO_2$ material.

In the phase change memory structure of the disclosure, the dielectric material, e.g., alumina, or germanium oxide, isolates the film of phase change memory material from any voids or seams in the core.

Geometrically, the cavity in the phase change memory structure may comprise a generally cylindrical hole in the substrate. In such generally cylindrical hole, the phase change memory material can be of annular form, extending from a floor of the generally cylindrical hole to at least the top surface of the substrate, with the floor of the generally cylindrical hole being formed by an electrode extending transversely to a central axis of the generally cylindrical hole. The phase change memory structure one fully fabricated has the phase change memory material in electrical contact with an electrode at respective ends of the cavity. In particular embodiments, the film of phase change material may be from 2 nm to 10 nm in thickness, and the cavity may have a diameter of from 15 to 100 nm.

In another aspect, the disclosure relates to a method of fabricating a phase change memory structure in a substrate containing a cavity closed at one end thereof with a bottom electrode, the method comprising:
conformally coating sidewall surface of the cavity and surface of the bottom electrode closing the cavity, with a phase change memory material film, to form an open core volume bounded by the phase change memory material film;
at least partially filling the open core volume with alumina or other dielectric material; and forming a top electrode at an upper portion of the cavity.

Such method may further comprise annealing the phase change memory material film. The cavity as indicated above may comprise a hole or a trench. The phase change memory material may comprise a chalcogenide alloy, as previously described, with any of the particular germanium-antimony-tellurium alloy compositions as described hereinabove. The substrate has indicated previously may be of any suitable type, and can for example comprise $SiO_2$ material.

In the method of fabricating the phase change memory structure, it is advantageous to fill the core with sufficient alumina to isolate the film of phase change memory material from any voids or seams in the core. The cavity, as indicated, may comprise a generally cylindrical hole in the substrate, e.g., with a diameter of from 15 to 100 nm, wherein the film of phase change material is from 4 nm to 10 nm in thickness.

The fabrication method may further comprise the use of a polishing process to remove excess phase change memory material and alumina at the upper portion of the cavity to form a ring-like phase change memory material end prior to forming the top electrode.

A further aspect the disclosure relates to a phase change memory device comprising at least one phase change memory structure as variously described hereinabove.

The dielectric material, e.g., alumina, may be center-filled in the core region of the cavity whose surfaces are coated with phase change memory material, e.g., chalcogenide alloy such as germanium-antimony-tellurium alloy, using aluminum precursors amenable to vapor deposition processes such as chemical vapor deposition and atomic layer deposition. Suitable aluminum precursors for CVD and ALD include aluminum alkyls such as trimethylaluminum (TMA), triethylaluminum (TEA), triisobutylaluminum (TIBA), aluminum alkyl hydrides such as dimethylaluminum hydride (DMAH), trimethylamine alane (TMAA), dimethylethylamine alane (DMEAA), tris(dimethylamido)aluminum (TDMAA), aluminum tris(2,2,6,6-tetramethyl-3,5-heptanedionate), and other organoaluminum compounds and complexes having suitable volatilization, transport, and decomposition properties for the deposition of alumina in the core region of the cavity, on the phase change memory material on the surfaces of the cavity. The vapor deposition may be carried out by CVD in an oxic atmosphere to form the deposited alumina, or by alternating aluminum and oxygen pulses in atomic layer deposition. Corresponding processes may be employed for center-filling the cavity with germanium oxide or other dielectric materials.

The process modality and process conditions therefor can be determined within the skill of the art based on the disclosure herein, to provide a core formation of alumina. The conformation of such core volume of alumina, advantageously is such as to isolate the phase change memory material from any void or seam formations, so that the alumina is an insulant medium in which voids or seams can be encapsulated without adverse effect on the phase change memory material in the cavity. In various implementations, the phase change material is conformally coated on the side wall surface of the cavity, so as to form an annular ring of phase change material when the cavity is of generally circular cross section, and with the alumina forming a generally cylindrical core of material bounded by the annular ring of phase change material. In forming the alumina in the core region, it may be advantageous to form successive layers of aluminum oxide in carrying out the filling of the core region, since the dielectric strength of the alumina material will thereby be maximized. In this respect, other dielectric material in place of alumina can be employed, e.g., titania (titanium dioxide), titania/alumina, germanium oxide, etc., in the broad practice of the present disclosure.

Referring now to the drawings, FIG. 1 is a cross-sectional tunneling electron microscope (TEM) image of a GST-filled trench ($SiO_2$-based) (left-hand portion of drawing) and an energy dispersive x-ray analysis plot for each of the germanium, antimony and tellurium components of the GST fill material (right-hand portion of drawing). In the GST-filled trench, a seam is formed. The seam is an interface in which the merged left- and right-hand GST formations deposited on the opposing trench side wall surfaces intersects. Seam formation is well-known in all deposition processes in which facing side walls are coated with deposited material, with the deposition continuing until the volume between the facing side walls is filled.

Figure 2:
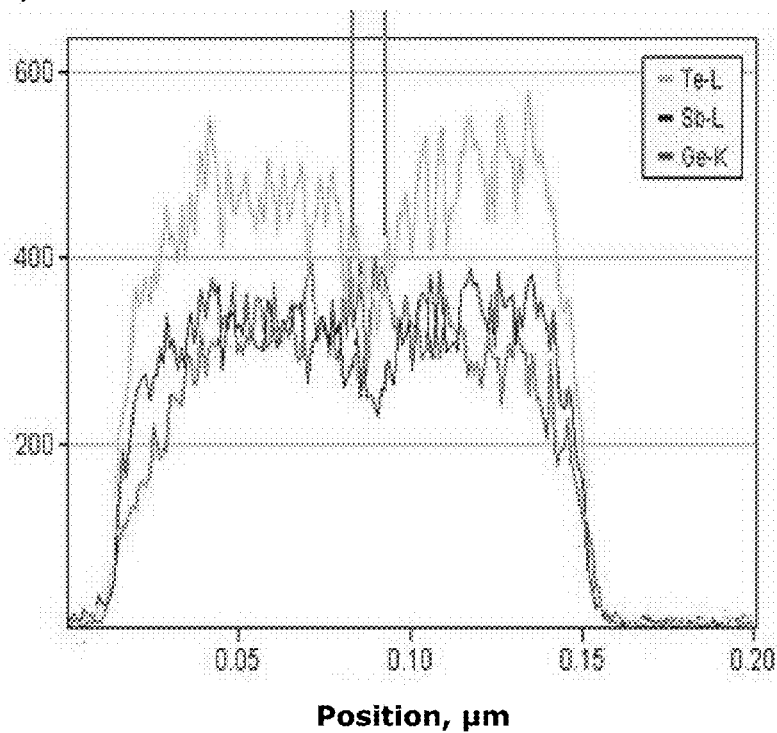
FIG. 2 is a energy dispersive x-ray analysis plot of FIG. 1, showing the x-ray counts of tellurium antimony and germanium.

The seam region of GST fill material will have a reduced density. The Energy Dispersive X-ray Analysis (EDX) spectrum shown in the right-hand portion of FIG. 1, and in enlarged form in FIG. 2, shows that across the middle of the structure of the TEM sample shown the left-hand portion of FIG. 1, there are reduced X-ray counts of tellurium (Te) and antimony (Sb), while the germanium (Ge) counts are seen to be flat.

The reduced Te and Sb counts in the seam region are about 25% for Te (from ~500 counts to 400 counts) and 20% for Sb (from 350 counts to 250 counts). The width of the seam is estimated to be 0.005-0.01 μm or 5-10 nm of the 100 nm width GST-filled trench. This can become a significant portion of the device volume if the trench structure is significantly narrower than that shown in FIG. 1. The existence of such a region with reduced Te and Sb counts reflects heterogeneity of the composition of the phase change memory material, with reduced overall (or averaged) density of GST inside the trench, assuming that the bulk volume of the phase change memory material away from the seam is at normal density. The narrower the trench, the more predominant is the low density seam area, and the lower the overall density of the GST in the trench will be.

Upon the first melting and re-solidification of phase change material, e.g., GST or other material such as GeTe, in the phase change memory (PCM) device, the overall volume of the phase change material will shrink, and the average composition will be lower in Te and Sb, and the volume of the phase change memory material in the trench will be reduced.

Figures 3, 4, 5:
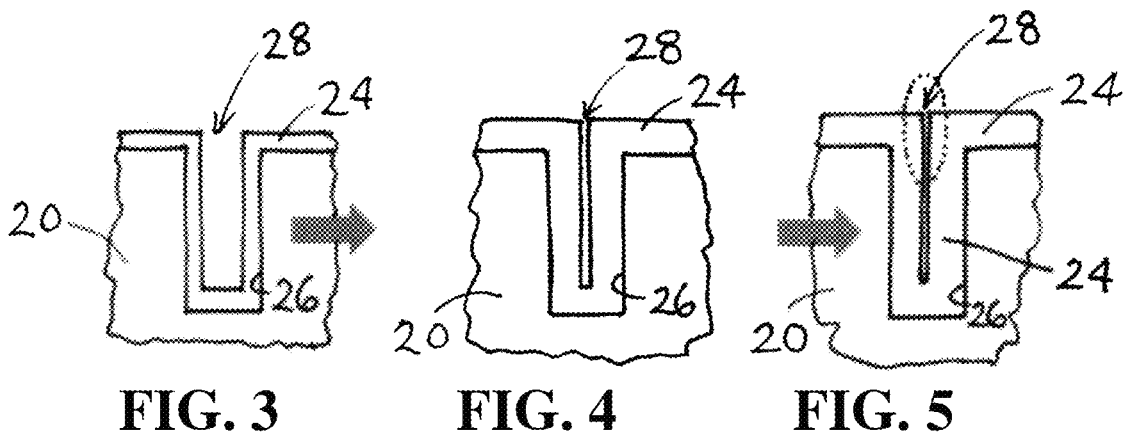
FIGS. 3-5 depict a schematic rendering of a process flow in which GST material is deposited in a trench structure, resulting in formation of a seam as shown in FIG. 5.

FIGS. 3-5 depict a schematic rendering of a process flow in which GST material 24 is deposited in a trench structure 26 in a substrate 20, resulting in formation of a seam as shown in FIG. 5 as a result of progressive closure of the trench opening 28 with increasing deposition of GST material.

In the initial deposition of GST on the side wall surface of the trench (FIG. 3), the deposition is similar in character to the deposition of GST on a planar surface, since GST can easily transport deeply into the trench and deposit on the side wall surface. Conformal deposition therefore can readily be conducted by CVD or ALD techniques, and fast growth of GST can be carried out.

Continued deposition of GST (FIG. 4) results in the inwardly extending growth layer of the GST from each side wall surface beginning to converge with one another. In this case, the opening width for the precursor is still larger than the precursor molecular size, and additional time is required for the precursor to transport into the interior of the opening. Slower growth rate is therefore necessary to allow filling of the remaining open region in the center of the core volume.

Figure 6:
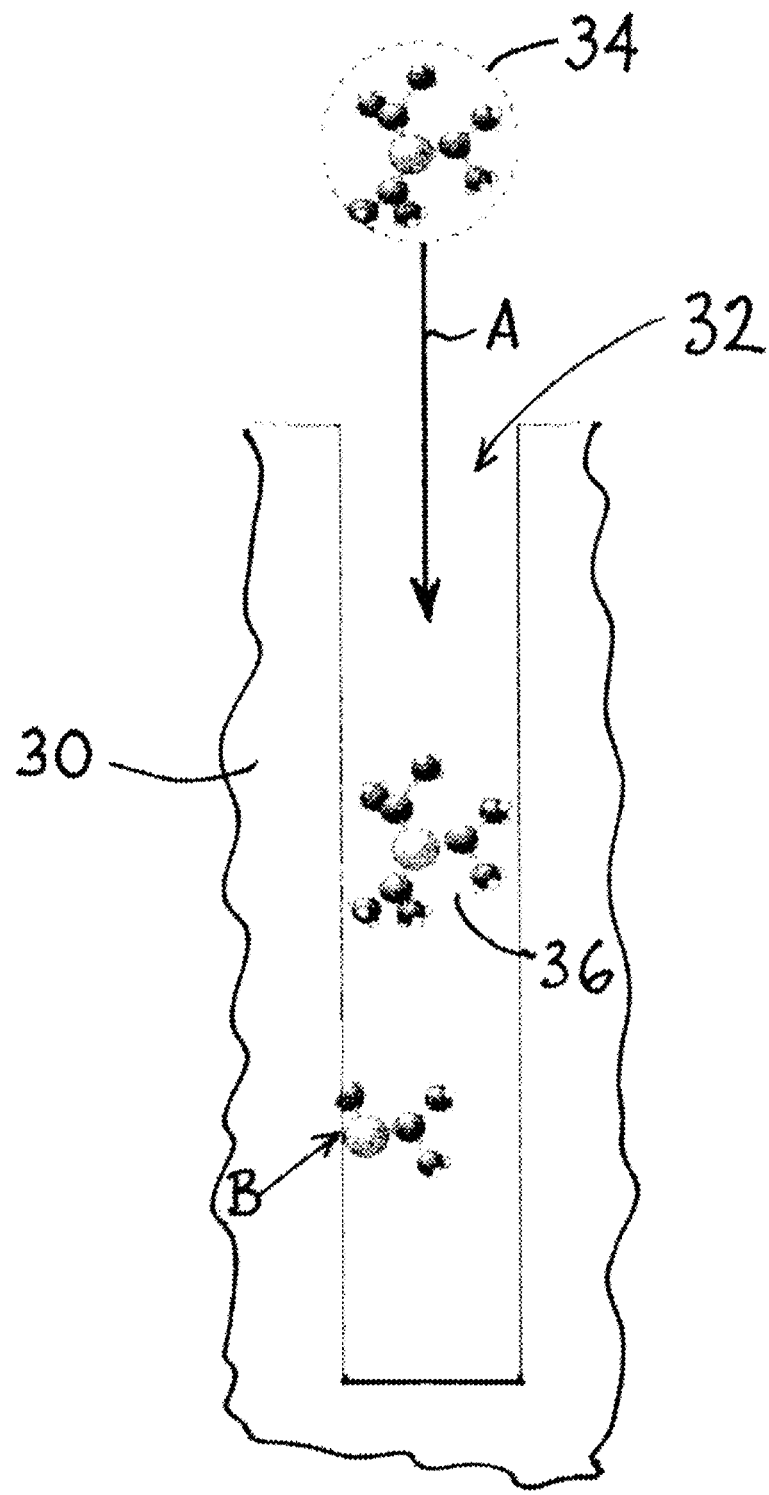
FIG. 6 is a schematic elevation view of a trench structure in which an antimony precursor, SbTDMA, is being deposited in the trench cavity, showing the potential for obstruction of the trench cavity by the precursor molecule.

At the subsequent point depicted in FIG. 5, the respective left-hand side and right-hand side of the respective side wall growth portions of the GST material are so close to one another that the transport of precursors into the trench becomes difficult as the width of the opening approaches the molecular dimensions of the precursors. This is shown more fully in FIG. 6, which is a schematic elevation view of a trench structure 34 in a substrate, in which an antimony precursor 34, SbTDMA, is being deposited in the trench cavity (transport direction being indicated by arrow A), showing the potential for obstruction of the trench cavity by the precursor molecule. As illustrated in FIG. 6, the incompletely reacted SbTDMA 36 will block transport of additional SbTDMA or other precursors such as $Te(tBu)_2$ or germanium precursors from entry into the narrow trench opening, e.g., an opening on the order of 5 Angstroms. Even partially reacted SbTDMA B with ligand(s) attached will serve to block additional precursor molecules from penetrating deep into the trench. As a result, a pile-up of incompletely reacted precursors may form, with the result that a low density area of GST will result.

The above-described seam or low density region will be manifested when using both CVD and ALD techniques.

FIGS. 7-9 depict a schematic rendering of process flow for fill of a trench cavity 42 in substrate 40 with GST material 46, showing formation of a "keyhole" void 50 in FIG. 9. FIG. 10 is a schematic elevation view of a portion of a trench cavity in substrate 60, showing the profile of the phase change memory material 62 deposited in the cavity, under differential growth rate conditions, resulting in thicker sidewall deposits at the upper portion of the cavity, in relation to the lower portion of the cavity, which is responsible for the formation of the keyhole void. When there is a deviation from ideal conformal deposition of the phase change material, with a higher growth rate v1 at an upper portion of the cavity side wall surface, in relation to a lower growth rate v2 at a lower portion of the cavity side wall surface, then a keyhole void will be formed. The larger the time required to fill the trench, the larger will be the keyhole void, under these imbalanced growth rate conditions.

For fast growth rate phase change memory materials, such as GST 225 alloy, the lower portion of the cavity will be more limited by molecular transport than the upper portion of the cavity, and the keyhole void formation will be correspondingly more pronounced. Thus, in non-conformal growth on a sidewall of a cavity, the growth rate on the wall surface near the bottom of the cavity will be slower than the growth rate near the entrance of the trench, due to molecular transport being easier at the area near the entrance of the cavity than in areas in the interior volume thereof.

Figure 11:
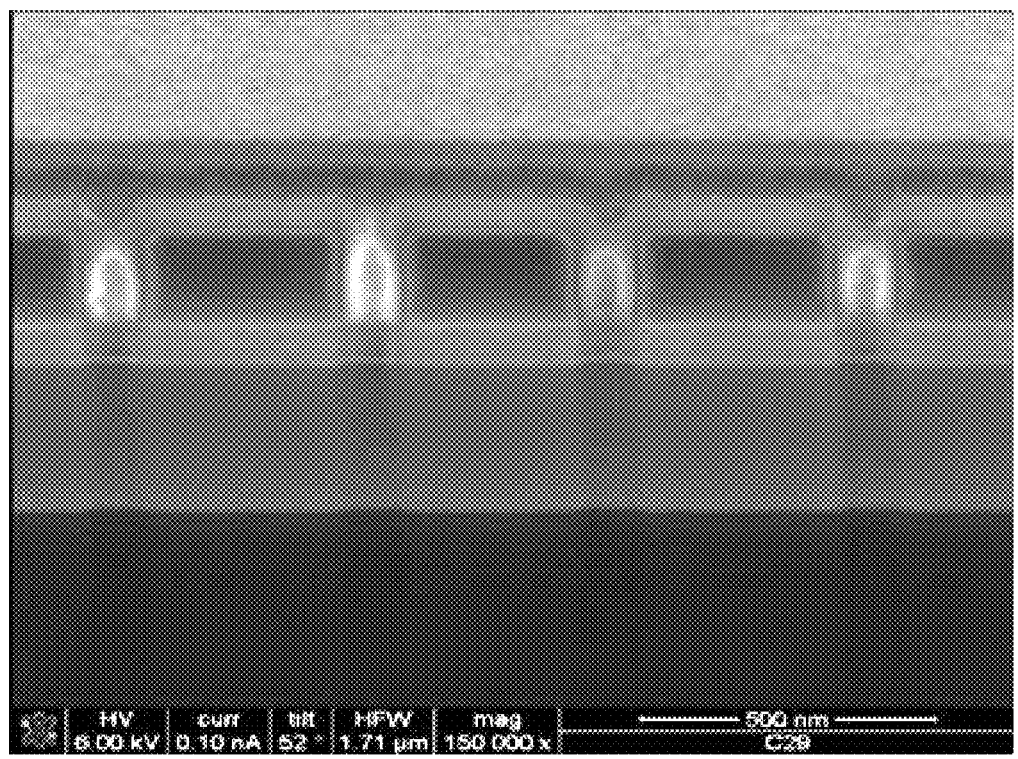
FIG. 11 is a photomicrograph of a GST-filled via structure, in which keyhole voids have been formed as a result of higher growth rate at the entrance of the via, when depositing a GST 225 composition.

FIG. 11 is a photomicrograph of a GST-filled via structure, in which keyhole voids have been formed as a result of higher growth rate at the entrance of the via, when depositing a GST 225 composition.

FIGS. 12-14 depict process flow in which deposition of phase change alloy material 72 in a trench in substrate 70 results in void seam formation 74.

FIG. 15 depicts a non-smooth GST deposit in trench structures, consistent with the schematic view of FIG. 14.

FIG. 16 is a tunneling electron microscope (TEM) Z contrast image, wherein the "dot" line in the middle of the GST-filled trench is a void.

FIG. 17 is a TEM dark view image in which the light dots of FIG. 16 are shown as dark dots in FIG. 17.

FIGS. 18-21 schematically depict a process flow in which a phase change memory alloy 82 is deposited in a cavity 88 in substrate 80 above a bottom electrode 86, resulting in a central opening 84 in the cavity, followed by deposition of alumina 90 in the central opening circumscribed by the phase change memory material, wherein voids 92 are isolated by the alumina from the phase change memory material 82 in the final PCM cell structure schematically shown in FIG. 21. The alumina 90 after the fill of the central opening is planarized by chemical mechanical polishing (CMP) or other planarization technique, following which a top electrode 96 is formed, as shown in FIG. 21.

In general, the dielectric material used for center fill of the phase change memory material in the cavity in which the phase change memory material is deposited on side wall surface of the cavity should have the following characteristics:

(i) good chemical stability and lack of adverse effect on the phase change memory material already deposited in the cavity;

(ii) good mechanical stability, to provide an effective capping of the seam and containment of voids inside the dielectric material, so that the seam and voids are not exposed to the phase change memory material, even after billions of cycles of phase change, and so that GST or other phase change material is not permitted to penetrate into the low density or void regions inside the $Al_2O_3$-filled central region of the cavity;

(iii) compatibility with the phase change memory material, so that any diffusion of the dielectric into the phase change memory material is preferably beneficial to phase change memory material properties, such as speed, data retention, and reliability;

(iv) compatibility with conformal deposition techniques such as CVD and ALD, enabling the dielectric material to be deposited in situ with the phase change memory material or in another chamber via vacuum transfer of the wafer substrate, or alternatively, enabling the dielectric material to be deposited ex situ, provided that the surface of the GST or other phase change material is protected against any negative impact of surface oxidation or similar occurrence, before the alumina fill of the cavity is carried out.

Alumina is a preferred dielectric material in the practice of the present disclosure, in consequence of the fact that in application to GST phase change memory materials, aluminum and alumina doping of GST is beneficial to GST enabling higher temperatures for data retention to be achieved, enabling threshold field to be significantly increased, and enhancing reliability of the GST memory. Alumina also is chemically inert and chemically and mechanically stable, very hard and strong, and exhibits superior conformal coating behavior when deposited from precursors such as trimethylaluminum (TMA) using ALD techniques. In addition, water vapor can be used as a co-reactant for ALD deposition of alumina, and is a very weak oxidizer that is highly benign to the GST phase change memory material.

Alumina can be deposited in the same chamber by ALD as is used for deposition of GST phase change memory material, e.g., using TMA as an aluminum precursor and water vapor as an oxidizer. Alternatively, ALD deposition of alumina can be carried out in a chamber other than the one that is used for CVD deposition of the GST phase change memory material, such as by using vacuum transfer for transport of the wafer from the first chamber to the second chamber.

In the processing of the phase change memory structure, it is necessary to remove the portion of the dielectric film overlying the phase change memory material to fabricate a top electrode on the phase change memory material. Such removal of the overlying dielectric material can be carried out in any suitable manner, e.g., by CMP or etching (physical etching or reactive ion etching. In some embodiments, additional phase change memory material can be deposited after the removal of the overlying dielectric material.

It is also within the purview of the present disclosure to provide the cavity in the substrate in the first instance having a tapered profile in cross-sectional elevation view, e.g., of upwardly diverging character, so as to compensate for the difference in growth rates at the upper portion of the cavity and lower portion of the cavity in the deposition of the phase change memory material.

Figure 22:
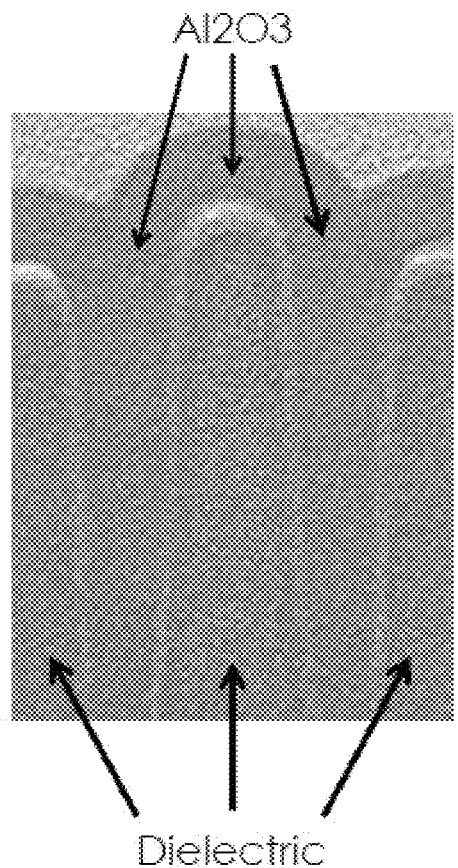
FIG. 22 is a TEM image of a portion of a phase change memory structure in which alumina has been deposited inside the dielectric by atomic layer deposition.

FIG. 22 is a TEM image of a portion of a phase change memory structure in which alumina has been deposited inside the dielectric by atomic layer deposition. The alumina ($Al_2O_3$) was deposited by a cyclic atomic layer deposition (ALD) process comprising a first step of contacting the substrate with aluminum precursor (trimethyl aluminum), for a period of 200 ms-5 seconds, followed by purging with inert gas (argon), for a purging duration of 30 seconds, followed by contacting with water vapor, for a period of 5-30 seconds, followed by purging with inert gas (argon), for a purging duration of 15 seconds, followed by the same sequence of steps. The process was carried out at pressure of 1 torr (133.3 Pa) with 20 sccm of argon flow constantly, and temperature in a range of 200° C.-300° C. This image evidences a highly conformal deposition of alumina in a phase change memory structure in which alumina is utilized to fill a seam or void in the phase change memory material.

As discussed previously herein, in utilizing alumina for filling of a core region bounded by facing material, it may be advantageous to form successive layers of aluminum oxide. Such utilization of thin layers of alumina can also be employed, in another aspect of the present disclosure, for production of smooth amorphous films of the phase change memory material.

Figure 23:
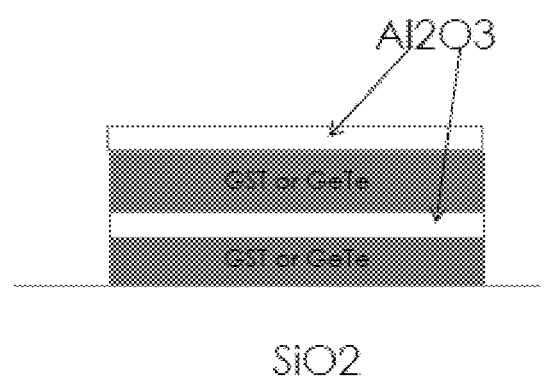
FIG. 23 is a schematic representation of a GST or GT structure in which a thin layer, e.g., monolayer, of alumina alternates between successive layers of the phase change memory material.

FIG. 23 is a schematic representation of a GST or GT structure in which a thin layer, e.g., monolayer, of alumina alternates between successive layers of the phase change memory material, e.g., GST or GT phase change memory material. In such manner, the phase change memory material can be deposited in a manner that will prevent the phase change memory films from growing into crystalline films or rough films. Thus, thin layers of the phase change memory material that are smooth can be formed, to avoid circumstances in which thicker growth of the phase change memory film leads to formation of rough films.

For example, the phase change memory material may be grown to a predetermined thickness, e.g., from 5 to 140 Å, at which the film is smooth and oxygen free. A thin layer of alumina, e.g., a monolayer or near-monolayer (2-4 monolayer thicknesses) thickness layer, then is deposited on the phase change memory material layer, following which another layer of phase change memory material at low thickness ensuring smooth character of the film is deposited, and so on, until the phase change memory material is built up to a satisfactory overall thickness. Accordingly, smooth thicker phase change memory material structures are enabled.

Thus, the disclosure contemplates a method of forming a phase change memory structure comprising a phase change memory material in a substrate, comprising filling seam(s) or void(s) in the phase change memory material with alumina deposited by atomic layer deposition.

A further aspect of the disclosure relates to a phase change memory structure comprising multiple layers of phase change memory material wherein each layer of phase change memory material is separated from a next successive layer of phase change material in the structure by a monolayer or near-monolayer film of alumina.

In such phase change memory structure, the layers of phase change memory material in the structure can each have a thickness at which the layer is smooth and amorphous. In specific embodiments, the layers of phase change memory material in the structure can each have a thickness in a range of from 5 to 140 Å.

The disclosure further contemplates a method of making a phase change memory structure, comprising depositing a phase change memory material alternatingly with depositing a monolayer or near-monolayer film of alumina, to form a phase change memory structure comprising multiple layers of the phase change memory material wherein each layer of the phase change memory material is separated from a next successive layer of the phase change material in the structure by a monolayer or near-monolayer film of alumina.

In such method, each layer of the phase change material is advantageously deposited at a thickness at which layer is smooth and amorphous. In specific embodiments, each layer of the phase change material can be deposited at a thickness in a range of from 5 to 140 Å. The method of making the phase change memory structure of such character can be suitably carried out with deposition of the phase change memory material and the alumina, in an atomic layer deposition process.

The disclosure in a further aspect relates to a phase change memory structure, comprising a substrate having a cavity extending from a surface of the substrate into an interior region thereof, wherein the cavity is bounded by side wall surface, wherein the cavity is coated on the side wall surface with a film of phase change memory material forming a core, and the core is filled with dielectric material containing void volume that is fully encapsulated in the dielectric material to isolate it from the phase change material.

The void volume may comprise one or multiple voids. In various embodiments, the void volume is generally centrally located in the interior region of the cavity. In other embodiments, the void volume comprises one or more voids of elongated form, and such void(s) of elongated form may be generally aligned with and in spaced relation to the side wall surface. The cavity in the phase change memory structure may be of any suitable form and geometry. For example, the cavity may be in the form of a hole, e.g., a cylindrical hole. Alternatively, the cavity is in the form of a trench.

In various embodiments, the cavity in the phase change memory structure comprises a floor, and the floor is coated with a film of the phase change memory material. The floor may for example be formed by an electrode extending transversely to a central axis of the cavity. The phase change memory structure in other embodiments may be constructed so that the phase change memory material is in electrical contact with an electrode at respective ends of the cavity.

The phase change memory structure may be fabricated with a film of phase change material that is from 2 nm to 10 nm in thickness. The cavity in the phase change memory structure may have a diameter of from 15 nm to 100 nm. The phase change memory material may be of any suitable type, and in a specific implementation may comprise a germanium-antimony-tellurium alloy, or a germanium telluride alloy. The substrate may comprise a suitable material such as $SiO_2$. The dielectric material may be of any useful dielectric species, e.g., alumina, germanium oxide, or other dielectric material.

The disclosure further relates to a phase change memory device that comprises at least one phase change memory structure as described herein.

The disclosure further contemplates a method of making a phase change memory structure in a substrate having a cavity extending from a surface of the substrate into an interior region thereof, wherein the cavity is bounded by side wall surface, such method comprising coating the side wall surface with a film of phase change memory material to form an open volume core, and depositing dielectric material in the core so as to fully encapsulate void volume in the dielectric material so that the void volume is isolated from the phase change material.

In such method, the film of phase change memory material may be coated on the side wall surface by a vapor deposition process, e.g., atomic layer deposition. As indicated hereinabove, the void volume may be generally centrally located in the interior region of the cavity. The void volume may comprise one or more voids of elongated form, e.g., elongate voids that are generally aligned with and in spaced relation to the side wall surface of the cavity. In specific embodiments, wherein the cavity is of cylindrical or otherwise straight-walled with vertically extending wall surface, the elongate voids may be generally aligned with the central axis of the cavity. The cavity may be of hole or trench form, may have a floor that is coated with the film of phase change memory material, and the floor may be formed by an electrode extending transversely to a central axis of the cavity. The phase change memory material in electrical contact with an electrode at respective ends of the cavity.

The film of phase change material can be deposited at a thickness of from 2 nm to 10 nm in the phase change memory structure, and the cavity may have a diameter of from 15 nm to 100 nm. The phase change memory material may comprise a germanium-antimony-tellurium alloy, or germanium telluride, or other PCM material. The substrate may comprise $SiO_2$ material. The dielectric material may comprise alumina or germanium oxide, or other suitable dielectric material.

The aforementioned method may further comprise integrating the phase change memory structure in a phase change memory device.

Figure 24:
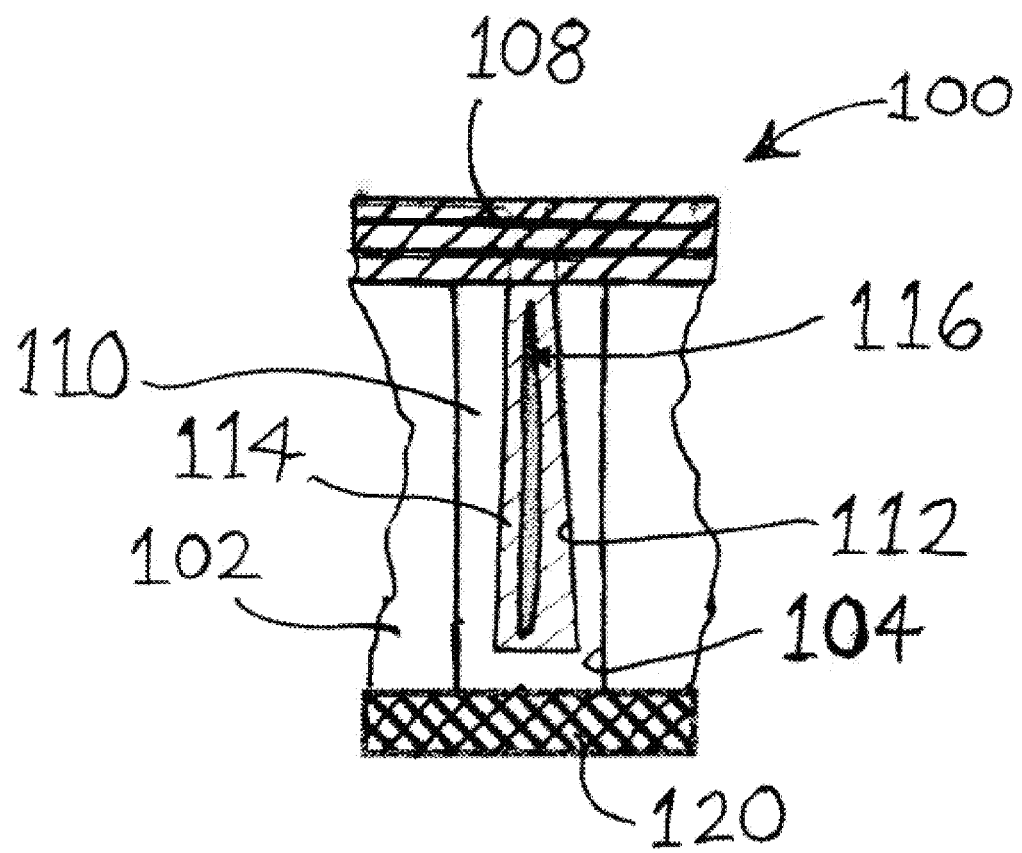
FIG. 24 is an elevation view, in cross section, of a phase change memory structure according to a further embodiment of the disclosure.

FIG. 24 is an elevation view, in cross section, of a phase change memory device structure 100 according to a further embodiment of the disclosure. The device structure as shown includes a substrate 102 in which is formed a hole 104, and the hole defines a cavity in which is deposited a phase change material 110, e.g., of GST or GeTe. The phase change memory material 110 forms a core bounded by the exterior surface 112 of the phase change memory material. Dielectric material 114 is filled in the core so as to fully encapsulate a longitudinally extending void 116. The hole is bounded at its respective ends with electrodes—an upper electrode 108 and a bottom electrode 120. In the structure shown in FIG. 24, the void by virtue of its encapsulation is isolated from contact with the phase change memory material.

Figure 25:
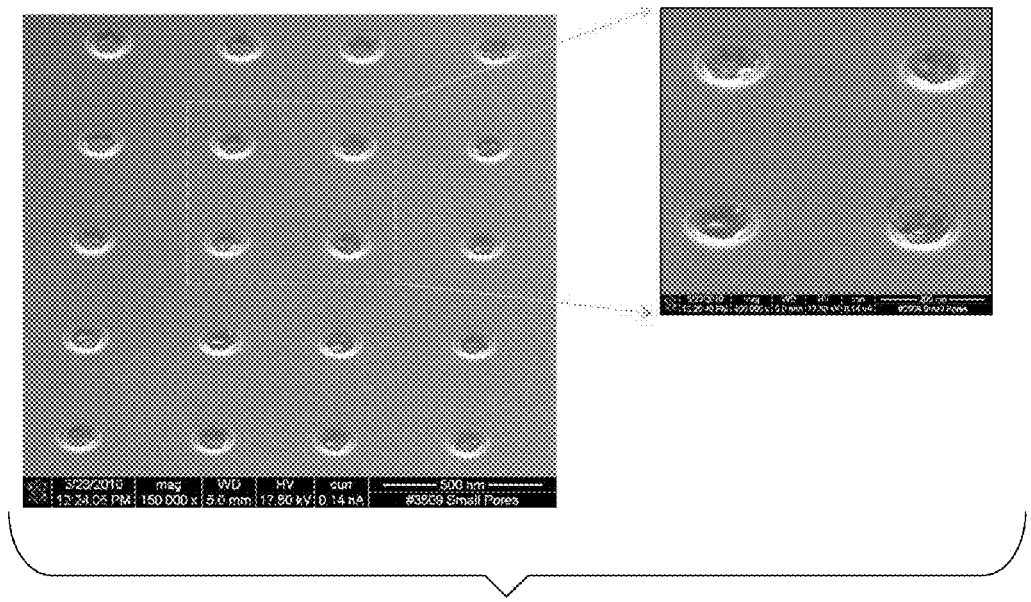
FIG. 25 is a photomicrograph, at magnification of 150,000 times, of a partially GST filled phase change memory device structure that has been completed by deposition of germanium and germanium oxide ($Ge_xO_y$) fill material (left-hand side) and a photomicrograph of a section of the device structure, at magnification of 400,000 times (right-hand side).

FIG. 25 is a photomicrograph, at magnification of 150,000 times, of a partially GST filled phase change memory device structure that has been completed by deposition of germanium and germanium oxide ($Ge_xO_y$) fill material (left-hand side) and a photomicrograph of a section of the device structure, at magnification of 400,000 times (right-hand side). Although not shown in such photomicrographs, the cavities therein utilize the germanium oxide fill material to encapsulate void volume in the core region of the cavity.

Figure 26:
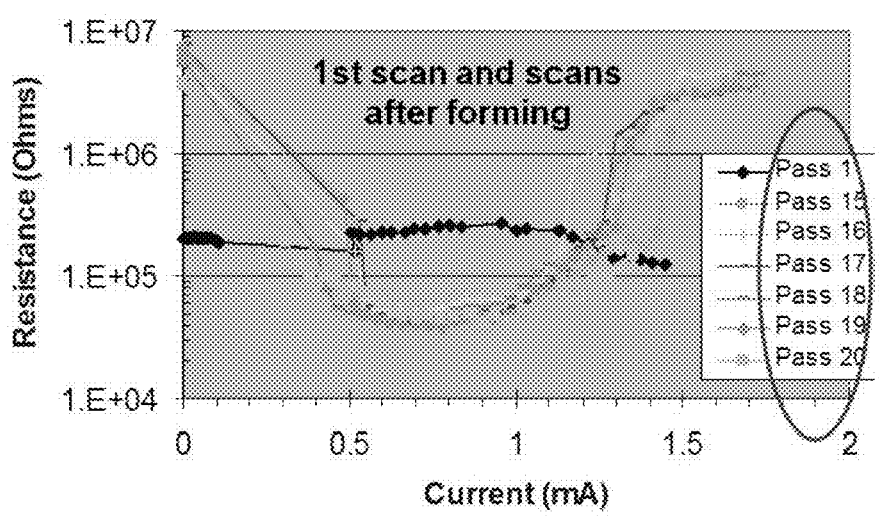
FIG. 26 is a graph of resistance, in ohms, as a function of current, in milliamps, for scanning passes including the first pass, and passes 15 through 20, for the GST/Ge/$Ge_xO_y$ phase change memory device structure of FIG. 25.

FIG. 26 is a graph of resistance, in ohms, as a function of current, in milliamps, for scanning passes including the first pass, and passes 15 through 20, for the GST/Ge/$Ge_xO_y$ phase change memory device structure of FIG. 25, showing the electrical performance characteristics of such device structure.

While the disclosure has been has been set out herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the invention as hereinafter claimed is intended to be broadly construed and interpreted, as including all such variations, modifications and alternative embodiments, within its spirit and scope.

What is claimed is:

1. A phase change memory structure, comprising a substrate having a cavity extending from a surface of the substrate into an interior region thereof, wherein said cavity is bounded by side wall surface, wherein the cavity is coated on said side wall surface with a film of phase change memory material forming a core including core volume bounded by the phase change material, and the core volume bounded by the phase change material is at least partially filled with a material selected from the group consisting of: (i) alumina; (ii) titania, (iii) titania and alumina.

2. The phase change memory structure of claim 1, wherein the core is at least partially filled with alumina.

3. The phase change memory structure of claim 1, wherein the core is at least partially filled with titania.

4. The phase change memory structure of claim 1, wherein the core is at least partially filled with titania and alumina.

5. A phase change memory structure, comprising a substrate having a cavity extending from a surface of the substrate into an interior region thereof, wherein said cavity is bounded by side wall surface, wherein the cavity is coated on said side wall surface with a film of phase change memory material forming a core, wherein the core is at least partially filled with multilayer material including multiple layers of the phase change memory material wherein each layer of the phase change memory material is separated from a next successive layer of the phase change memory material by a film of (a) alumina, (b) titania, (c) titania and alumina, or (d) germanium oxide.

6. The phase change memory structure of claim 5, wherein the core is at least partially filled with multilayer material including multiple layers of the phase change memory material wherein each layer of the phase change memory material is separated from a next successive layer of the phase change material by a film of alumina.

7. The phase change memory structure of claim 5, wherein the core is at least partially filled with multilayer material including multiple layers of the phase change memory material wherein each layer of the phase change memory material is separated from a next successive layer of the phase change material by a film of titania.

8. The phase change memory structure of claim 5, wherein the phase change memory material comprises a germanium-antimony-tellurium alloy or germanium telluride.

9. The phase change memory structure of claim 5, wherein the core is at least partially filled with multilayer material including multiple layers of the phase change memory material wherein each layer of the phase change memory material is separated from a next successive layer of the phase change material by a film of titania and alumina.

10. The phase change memory structure of claim 5, wherein the core is at least partially filled with multilayer material including multiple layers of the phase change memory material wherein each layer of the phase change memory material is separated from a next successive layer of the phase change material by a film of germanium oxide.

11. A phase change memory device comprising at least one phase change memory structure of claim 5.

12. A method of making a phase change memory structure in a substrate having a cavity extending from a surface of the substrate into an interior region thereof, wherein said cavity is bounded by side wall surface, said method comprising coating said side wall surface with a film of phase change memory material to form an open volume core including core volume bounded by the phase change material, and depositing in said core volume bounded by the phase change material a material selected from the group consisting of: (i) alumina; (ii) titania, (iii) titania and alumina.

13. The method of claim 12, comprising depositing alumina in said core.

14. The method of claim 12, comprising depositing titania in said core.

15. The method of claim 12, comprising depositing titania and alumina in said core.

16. A method of making a phase change memory structure in a substrate having a cavity extending from a surface of the substrate into an interior region thereof, wherein said cavity is bounded by side wall surface, said method comprising coating said side wall surface with a film of phase change memory material to form an open volume core, and depositing in said core a multilayer material including multiple layers of the phase change memory material wherein each layer of the phase change memory material is separated from a next successive layer of the phase change material by a film of (a) alumina, (b) titania, (c) titania and alumina, or (d) germanium oxide.

17. The method of claim 16, comprising depositing in said core said multilayer material including multiple layers of the phase change memory material wherein each layer of the phase change memory material is separated from a next successive layer of the phase change material by a film of alumina.

18. The method of claim 16, comprising depositing in said core said multilayer material including multiple layers of the phase change memory material wherein each layer of the phase change memory material is separated from a next successive layer of the phase change material by a film of titania.

19. The method of claim 16, comprising depositing in said core said multilayer material including multiple layers of the phase change memory material wherein each layer of the phase change memory material is separated from a next successive layer of the phase change material by a film of titania and alumina.

20. The method of claim 16, comprising depositing in said core said multilayer material including multiple layers of the phase change memory material wherein each layer of the phase change memory material is separated from a next successive layer of the phase change material by a film of germanium oxide.

* * * * *